United States Patent
Chu et al.

(10) Patent No.: US 12,334,335 B2
(45) Date of Patent: *Jun. 17, 2025

(54) METHOD OF OPTIMIZING FILM DEPOSITION PROCESS IN SEMICONDUCTOR FABRICATION BY USING GAS SENSOR

(71) Applicant: TAIWAN SEMICONDUCTOR MANUFACTURING CO., LTD., Hsinchu (TW)

(72) Inventors: Rei-Lin Chu, Hsinchu (TW); Chih-Ming Chen, Hsinchu (TW); Chung-Yi Yu, Hsinchu (TW); Yeur-Luen Tu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 471 days.

This patent is subject to a terminal disclaimer.

(21) Appl. No.: 17/569,819

(22) Filed: Jan. 6, 2022

(65) Prior Publication Data
US 2022/0139695 A1 May 5, 2022

Related U.S. Application Data

(63) Continuation of application No. 16/786,870, filed on Feb. 10, 2020, now Pat. No. 11,232,946.

(51) Int. Cl.
*H01L 21/02* (2006.01)
*B23K 26/14* (2014.01)
(Continued)

(52) U.S. Cl.
CPC ......... *H01L 21/0228* (2013.01); *B23K 26/14* (2013.01); *H01L 21/02057* (2013.01);
(Continued)

(58) Field of Classification Search
CPC .......... H01L 21/0228; H01L 21/02057; H01L 21/67161; H01L 21/67207; H01L 21/3065; B23K 26/14
See application file for complete search history.

(56) References Cited

U.S. PATENT DOCUMENTS 6,624,078 B1 * 9/2003 Ravkin ................ H01L 22/34
438/758
2011/0308453 A1 12/2011 Su et al.

FOREIGN PATENT DOCUMENTS

EP 1174527 A1 * 1/2002 ......... C23C 16/4405

OTHER PUBLICATIONS

Azizpour et al. "Effective coating of titania nanoparticles with alumina via atomic layer deposition" Applied Surfaces Science 426 (2017) 480-496. (Year: 2017).*

* cited by examiner

*Primary Examiner* — Robert S Walters, Jr.
(74) *Attorney, Agent, or Firm* — Maschoff Brennan

(57) ABSTRACT

In accordance with some embodiments, a method for processing semiconductor wafer is provided. The method includes introducing a first processing gas of an atomic layer deposition (ALD) process on the semiconductor substrate in a chamber; introducing a second processing gas of the ALD process on the semiconductor substrate in the chamber; creating an exhaust flow from the chamber; monitoring a concentration of the first processing gas of the ALD process in the exhaust flow; in response to the monitored concentration of the first processing gas of the ALD process in the exhaust flow, introducing a cleaning gas into the chamber.

20 Claims, 11 Drawing Sheets

(51) Int. Cl.
*H01L 21/67* (2006.01)
*H01L 21/3065* (2006.01)
(52) U.S. Cl.
CPC .. *H01L 21/67161* (2013.01); *H01L 21/67207* (2013.01); *H01L 21/3065* (2013.01)

METHOD OF OPTIMIZING FILM DEPOSITION PROCESS IN SEMICONDUCTOR FABRICATION BY USING GAS SENSOR

PRIORITY CLAIM AND CROSS-REFERENCE

The present application is a Continuation Application of the U.S. application Ser. No. 16/786,870, filed Feb. 10, 2020, which is herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

Some process steps used in fabricating semiconductors include oxidation, diffusion, doping, annealing, etching and film deposition. These processes are typically performed at elevated temperatures within heated controlled environments. Film deposition is a reactive process used to produce or deposit thin films of material on a semiconductor wafer including, but not limited to, metals, silicon dioxide, tungsten, silicon nitride, silicon oxynitride, and various dielectrics. An unsatisfactory uniformity of the film deposited on the semiconductor wafer by film deposition may adversely affect the function of the semiconductor devices.

Although existing devices and methods for producing or depositing thin films of material on the wafer have been generally adequate for their intended purposes, they have not been entirely satisfactory in all respects. Consequently, it would be desirable to provide a solution for forming the thin films for use in a wafer processing apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
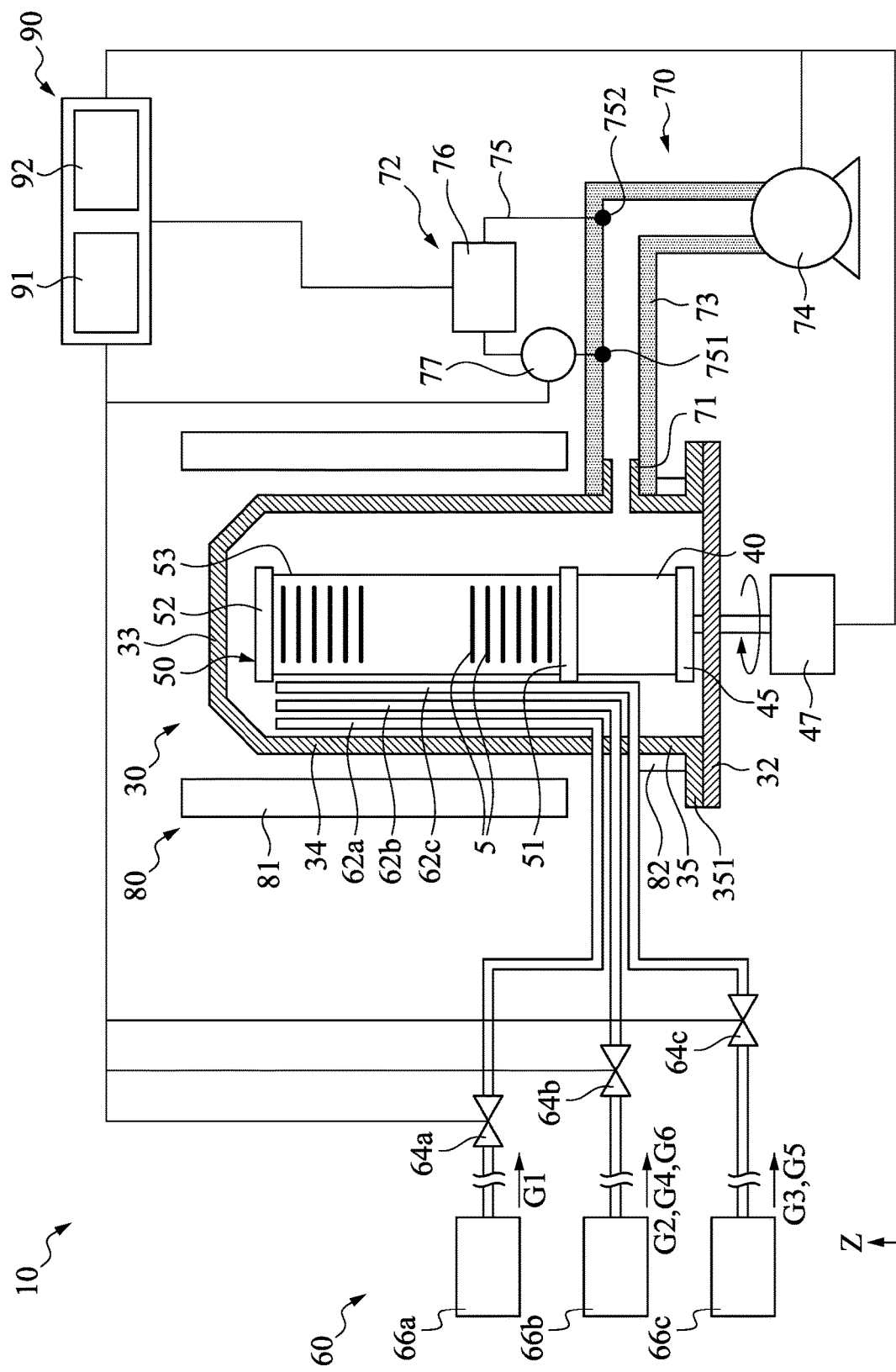
FIG. 1 shows a schematic diagram of one embodiment of a wafer fabricating system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device fabrication includes many different processes. One such process is an Atomic Layer Deposition (ALD) Process. An ALD process involves sequentially and alternatingly applying different materials to form a thin film layer on a substrate positioned within a deposition chamber. Particularly, the ALD process involves a number of cycles. Each cycle involves a deposition process and a purge process. However, residual gas on the semiconductor wafer after the ALD process may convert from gaseous state to solid or liquid state while a temperature drop occurs, which may adversely affect subsequent process steps. To address this issue, the present disclosure is directed to ALD method that reduces residual gas on the semiconductor wafer. In one example, the residual gas in a chamber is detected, and time duration or a flow rate for supplying a cleaning gas for absorbing the residual gas is determined by the result of the detection.

FIG. 1 shows a schematic diagram of one embodiment of a wafer fabricating system 10 for performing ALD process on semiconductor wafers 5 in accordance with some embodiments. However, the wafer fabricating system 10 is not limited to perform ALD process and may be used wherever a processing gas is supplied to a chamber and passes through a surface of the wafer 5. For example, the wafer fabricating system 10 may be a system for performing a normal CVD process, an etching or an annealing process in semiconductor fabrication.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the wafer fabricating system 10 includes a chamber 30, an insulation cap 40, a wafer boat 50, a gas supplying module 60, a gas exhausting module 70 and a heating assembly 80. Additional features can be added to the wafer fabricating system 10. Some of the features described below can be replaced or eliminated for additional embodiments of the wafer fabricating system 10.

The chamber 30 includes a tube 31 and a sealing lid 32, in accordance with some embodiments. The tube 31 extends a height in its longitudinal axis Z and has a top side 33, a sidewall 34, and a bottom side 35. The top side 33 is closed, and the bottom side 35 is open to allow the wafer boat 50 to be inserted into and removed from the chamber 30 for batch processing of the semiconductor wafers 5. The top side 33 and the bottom side 35 are located at two opposite sides of the tube 31 and arranged along the longitudinal axis Z. The side wall 34 connects the top side 33 to the bottom side 35. In one embodiment, the bottom side 35 may be provided with a flange 351 as shown in FIG. 1 for receiving the sealing lid 32.

The chamber 30 may have a cylindrical shape in one embodiment and may be made of quartz or any other suitable material, like SiC for example, but without limitation. The chamber 30 may include a coating such as polysilicon or another coating material typically used depending on the type of process conducted in the chamber. The chamber 30 may have any suitable height or length depending on the number of wafers to be processed in each batch. In some exemplary embodiments, the chamber 30 may have a representative vertical height or length of 100-150 cm.

The insulation cap 40 is configured to minimize the heat lost via the sealing lid 32. In some embodiments, the insulation cap 40 is positioned in a lower site of the chamber 30 that is approximate to the bottom side 35 and includes a quartz base. In some embodiments, the insulation cap 40 is placed on a rotation stage 45. The rotation stage 45 is positioned on the sealing lid 32. In addition, a driving member 47, such as a motor, is connected to the rotation stage 45. The driving member 47 is arranged such that, in operation, the rotation stage 45 is rotatable about at a rotation axis that is parallel to the longitudinal axis Z of the chamber 30, and the wafer boat 50 positioned on the rotation stage 45 is rotated. Therefore, the uniformity of the thin film in a film deposition process is improved.

The wafer boat 50 is adapted for supporting and holding a number of vertically-stacked semiconductor wafers 5 and allowing reactant gas to flow horizontally over the face of the semiconductor wafers 5 to build the desired film thicknesses thereon. In some embodiments, the wafer boat 50 is positioned over the insulation cap 40 and includes a bottom plate 51, a top plate 52 and a number of columns 53.

The bottom plate 51 and the top plate 52 are arranged to face each other. The columns 53 connect the bottom plate 51 to the top plate 52. Each of the columns 53 has grooves (not shown) for directly holding the semiconductor wafers 5 to be placed in multiple stages or for holding ring-shaped support plates on which the semiconductor wafers 5 are to be placed in multiple stages.

A vertical spacing of semiconductor wafers 5 in wafer boat 50 is about 6-10 mm apart in some embodiments. The wafer boat 50 may be sized to hold 50-125 semiconductor wafers 5 or more in some embodiments; however, any suitable number of wafers may be held by the wafer boat depending on the height of the chamber 30 provided. The wafer boat 50 may be made of quartz, SiC, Si or any other suitable material commonly used in the art.

The wafer boat 50 may be fixed on the insulation cap 40 by any suitable method. For example, the wafer boat 50 may be fixed on the insulation cap 40 via fastening members, such as screws. The fastening members pass through the bottom plate 51 and a top surface of the insulation cap 40 to fix the bottom plate 51 to the top surface of the insulation cap 40; however, any suitable method for fastening may be used.

The gas supplying module 60 is configured to supply of the processing gas into the chamber 30. In some embodiments, the gas supplying module 60 includes a number of gas tubes, such as gas tubes 62a, 62b, and 62c. Each of the gas tubes 62a, 62b, and 62c includes a vertical portion extends along a direction that is parallel to the longitudinal axis Z from the bottom side 35 to a position adjacent to the top side 33 of the tube 31.

In some embodiments, each of the gas tubes 62a, 62b, and 62c includes a number of injection holes (not indicated in the figures) passing through the wall of each of the gas tubes 62a, 62b, and 62c for discharging gas in the gas tubes 62a, 62b, and 62c to the interior of the chamber 30. The number of injection holes may correspond to the number of slots formed in the columns 53 of the wafer boat 50. For example, each of the columns 53 of the wafer boat 50 has 180 slots for supporting the semiconductor wafers 5, and the gas tubes 62a, 62b, and 62c each includes 180 injection holes formed thereon.

In some embodiments, a number of flow controlling members, such as flow controlling members 64a, 64b and 64c, are connected to the gas tubes 62a, 62b, and 62c and are configured to control the connection and delivery rate of the processing gas or purging gas to the chamber 30. The flow controlling members 64a, 64b and 64c may be controlled by control signals issued from the control module 90. The flow controlling members 64a, 64b and 64c may include devices such as valves, flow meters, sensors, and the like.

In some embodiments, the gas tubes 62a, 62b, and 62c are connected to a gas sources, such gas sources 66a, 66b and 66c are configured to store at least one processing gas or purging gas for facilitating the film deposition process performed in the chamber 30. In some embodiments, the processing gas stored in each of the gas sources 66a, 66b and 66c are different. For example, the gas sources 66a is configured to store a metal ($M_1$) containing gas with the formula $M_1L_T$ or $M_1E_U$, where L is a halogen (F, Cl, Br, I) and T is an integer greater than 0 or where E is an organic moiety containing carbon (C) and hydrogen (H), or C, H and nitrogen (N), or C, H and oxygen (O) and where U is an integer >0. In some embodiments, the metal $M_1$ is Ta, Ti, or W. A representative source gas for Ti is $TiCl_4$ (titanium tetrachloride) or $Ti\{OCH(CH_3)_2\}_4$. A Ta source gas is $Ta\{N(CH_3)_2\}_5$ also known as PDMAT and for W is $WF_6$. The gas source 66b is configured to store an inert gas, such as Ar, He, or $N_2$. The gas source 66c is configured to store nitrogen source gas such as $NH_3$ or $N_2H_4$.

The gas exhausting module 70 is configured to remove the gaseous materials or plasma in the chamber 30. In some embodiments, the gas exhausting module 70 includes an outlet port 71, an exhaust conduit 73, a gas detection module 72 and a pump 74.

In some embodiments, the outlet port 71 is connected to the lower portion of the side wall 34 that is adjacent to the bottom side 35 for guiding an exhaust flow from the chamber 30. The outlet port 71 may be positioned at an opposite side of the gas tubes 62a, 62b, and 62c relative to the longitudinal axis Z. The outlet port 71 may be formed integrally with the tube 31 and made of quartz, SiC, Si or any other suitable material commonly used in the art. The exhaust conduit 73 is connected to the outlet port 71 for guiding an exhaust flow from the outlet port 71 to the pump 74. The exhaust conduit 73 may made of anti-corrosion material such as stainless steel. In some embodiments, all the gaseous materials or plasma in the tube 31 removed from the tube 31 is pumped out through the outlet port 71 and the exhaust conduit 73 during a film deposition process. The pump 74 is connected to the exhaust conduit 73 and configured to create the exhaust flow from the chamber 30. The flow rate of the exhaust flow in the exhaust conduit 73 may be adjusted by controlling the output power of the pump 74 according to a control signal issued from the control module 90. The pump 74 may include, but is not limited to, a turbo-molecular pump.

The gas detection module 72 is configured to detect at least one parameter in relation to the exhausting flow from the chamber 30. In one embodiment, the gas detection module 72 includes a gas line 75, a gas sensor 76 and a valve 77. The gas line 75 is connected to the exhaust conduit 73 in an upstream of the pump 74. In some embodiments, the gas line 75 has two ends 751 and 752. The gas line 75 is connected to the exhaust conduit 73 through the two ends 751 and 752. Therefore, a portion of the exhaust flow could flow into the gas line 75 through the end 751 of the gas line 75 and return back to the exhaust conduit 73 through the end 752 of the gas line 75. However, it should be appreciated that many variations and modifications can be made to embodiments of the disclosure. In some other embodiments, the gas line 75 is a conduit with one closed end, and the gas line 75 is connected to the exhaust conduit 73 through another open end.

The gas sensor 76 is configured to detect parameters related to the exhaust flow that include concentration of the exhaust flow, a flow rate of the exhaust flow, a gas pressure of the exhaust flow, a composition of the exhaust flow and/or the species of the exhaust flow, and generate detection signal based on the detected results. The valve 77 is configured to control the connection of the exhaust flow into the gas line 75. The valve 77 may be controlled by control signals issued from the control module 90. In some embodiments, the gas sensor 76 and the vale 77 are connected to the gas line 75, and the valve 77 is positioned closer to a point where the gas line 75 is connected to the exhaust conduit 72 (i.e., the end 751 of the gas line 75) than the gas sensor 76. That is, when the valve 77 is turned off, no exhaust flow is allowed to flow from the end 751 to the gas sensor 76, and when the valve 77 is turned on the exhaust flow flows through the valve 77 before reaching the gas sensor 76. In some embodiments, the gas sensor 76 is a residual gas analyzer (RGA), and monitors a concentration of a specific gaseous material such as $TiCl_4$ in the exhaust flow.

In some embodiments, the heating assembly 80 is arranged along the sidewall 34 of the chamber 30. In some embodiments, the heating assembly 80 includes a number of sidewall heaters, such as sidewall heaters 81 and 82, provided along the sidewall 34 of the chamber 30 from the bottom side 35 to the top side 33. In some embodiments, the sidewall heaters 81 and 82 are electric resistance type heaters having controllable heat output which may be regulated by adjusting the energy input to each heater via a control module 90. The heat output from the sidewall heaters 81 and 82 may be fine-tuned to adjust the temperature in respective heater zone. In some embodiments, the sidewall heaters 81 and 82 extend around the entire circumference of chamber 30. The electric resistance coils are electrically coupled via conductors to an electrical power supply, which may be routed through suitable variable resistance electrical controls as typically used in the industry to allow the heat output (e.g. Btu/h) to be adjusted from the sidewall heaters 81 and 82.

The control module 90 controls and directs the fabrication tools, such as the chamber 30, the gas supplying module 60, the gas exhausting module 70, and the heating assembly 80 to start and stop various processes involved in the film deposition process.

In some embodiment, the control module 90 includes a processor 91 and a memory 92. The processor 91 is arranged to execute and/or interpret one or more set of instructions stored in the memory 92. In some embodiments, the processor 91 is a central processing unit (CPU), a multi-processor, a distributed processing system, an application specific integrated circuit (ASIC), and/or a suitable processing unit.

The memory 92 includes a random access memory or other dynamic storage device for storing data and/or instructions for execution by the processor 91. In some embodiments, the memory 92 is used for storing temporary variables or other intermediate information during execution of instructions to be executed by the processor 91. In some embodiments, the memory 92 also includes a read-only memory or other static storage device for storing static information and instructions for the processor 91. In some embodiments, the memory 92 is an electronic, magnetic, optical, electromagnetic, infrared, and/or a semiconductor system (or apparatus or device). For example, the memory 92 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 92 includes a compact disk-read only memory (CD-ROM), a compact disk-read/write (CD-R/W), and/or a digital video disc (DVD).

Figure 2:
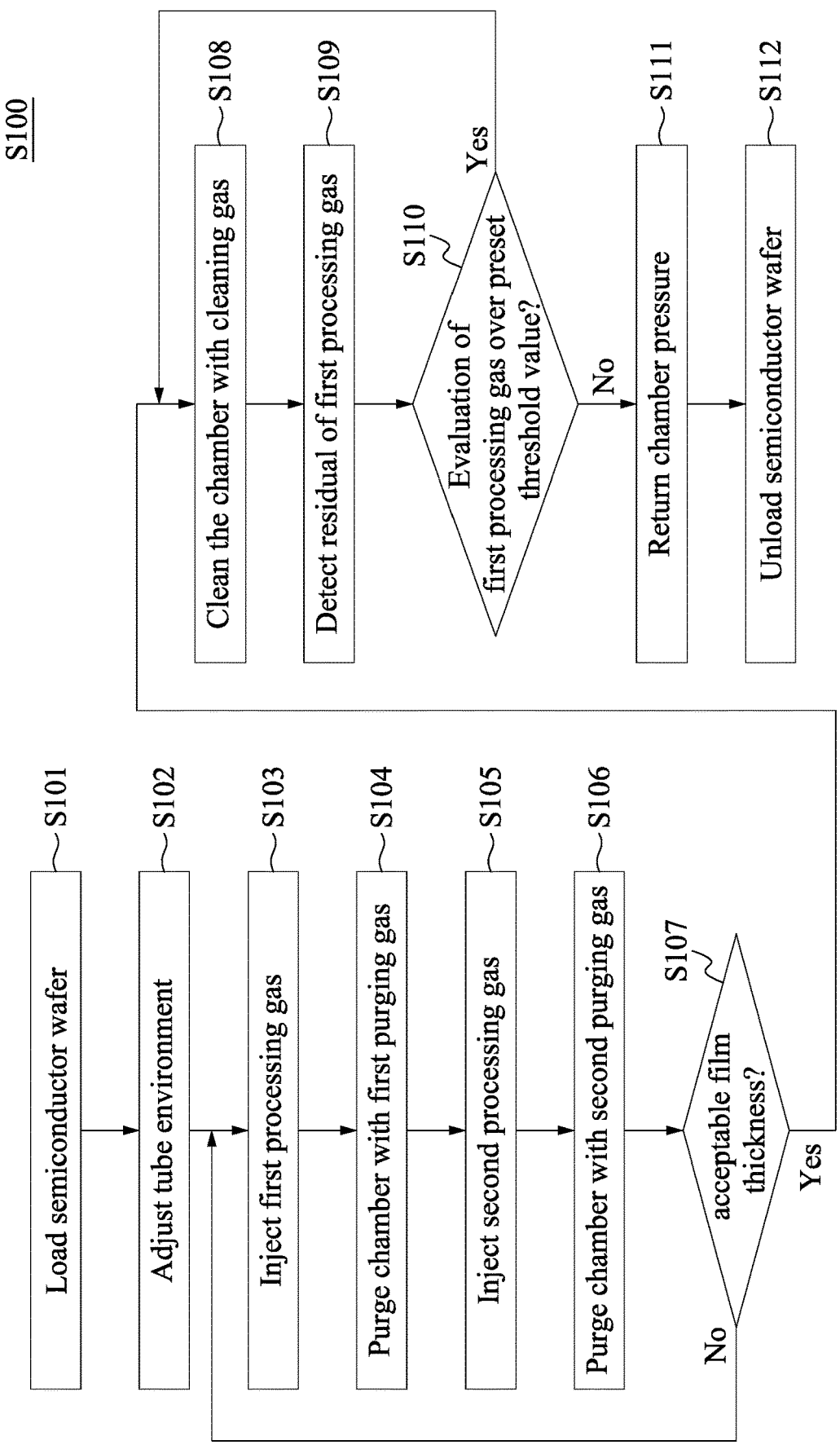
FIG. 2 shows a flow chart illustrating a method for processing a semiconductor wafer in a wafer fabricating system, in accordance with some embodiments.

FIG. 2 is a flow chart illustrating a method S100 for processing semiconductor wafers 5 in the wafer fabricating system 10, in accordance with some embodiments. For illustration, the flow chart will be described along with the drawings shown in FIGS. 1 and 3-5. Additional operations can be provided before, during, and after the method S100, and some of the operations described can be replaced or eliminated for other embodiments of the method.

The method S100 begins with operation S101, in which semiconductor wafers 5 are loaded into the chamber 30 of the wafer fabricating system 10. In some embodiments, to load the semiconductor wafers 5 into the wafer boat 50, the sealing lid 32 and the insulation cap 40 is separated from the tube 31 by means of the lifting mechanism (not shown in figures), and the wafer boat 50 are moved outside the cavity defined by the tube 31. The semiconductor wafers 5 may be moved into the wafer boat 50 by a robot arm (not shown in figures) with a blade.

Figure 3:
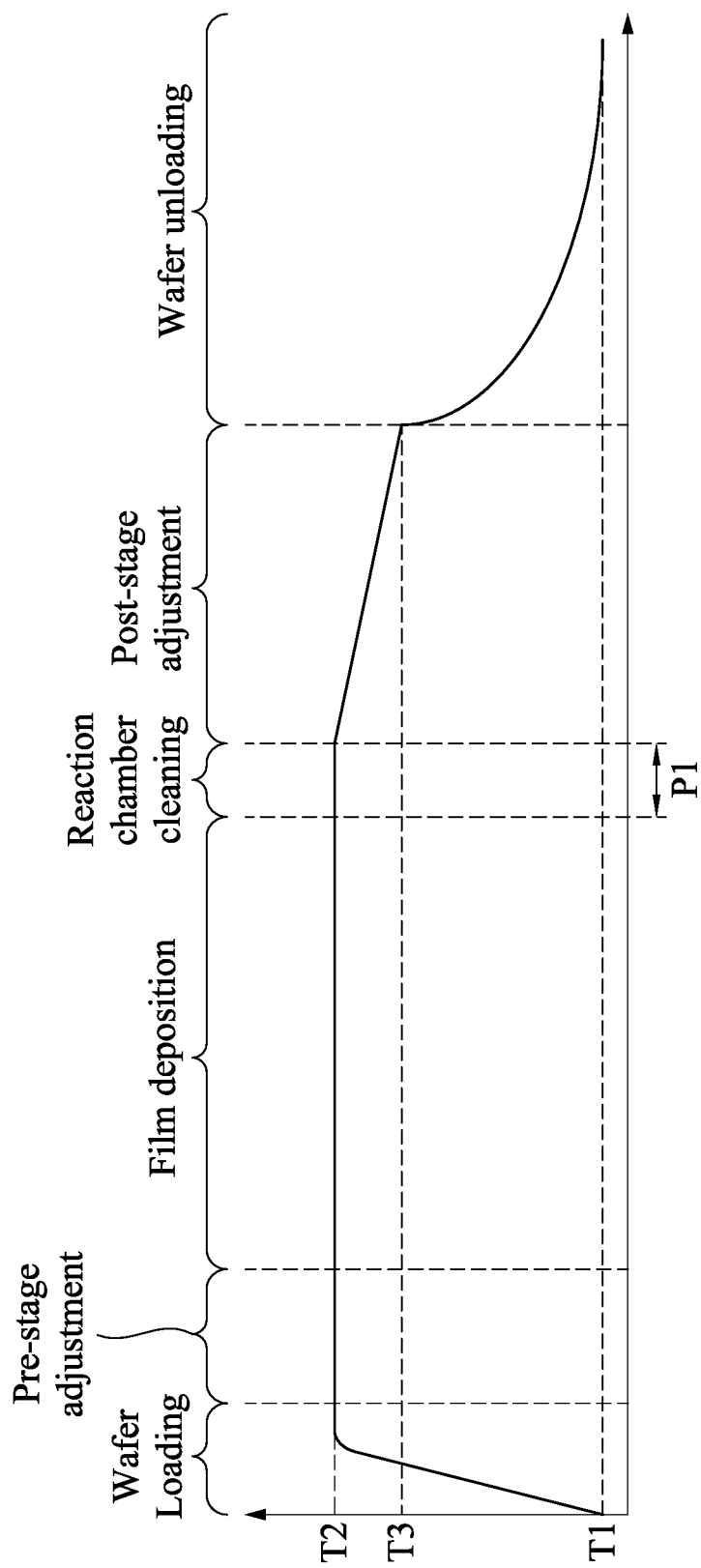
FIG. 3 shows a graph of temperature in a furnace versus time in a process for processing a semiconductor wafer, in accordance with some embodiments.

After the semiconductor wafers 5 are loaded to the wafer boat 50, the wafer boat 50 is inserted into the chamber 30. The wafer boat 50 may be loaded in the tube 31 by lifting up the sealing lid 32 and the insulation cap 40 by means of the lifting mechanism (not shown in figures). When the sealing lid 32 and the insulation cap 40 are connected to the bottom side 35 of the tube 31, the wafer boat 50 is located in a gas-tight chamber 30. In some embodiments, as shown in FIG. 3, before the loading of the semiconductor wafers 5, the tube 31 is heated by the sidewall heaters 81 and 82 to a temperature T1. After the loading of the semiconductor wafers 5, temperature in the chamber 30 is increased from temperature T1 to temperature T2 due to a gas-tight chamber 30 is established.

The method S100 continues with operation S102, in which environment adjustment is executed in the tube 31. In some embodiments, as shown in FIG. 3, a pre-stage adjustment process is performed after the loading of the semiconductor wafer to adjust at least one environmental factor in the tube 31 of the chamber 30. For example, the pre-stage adjustment process includes continuously heating the tube 31 so as to allow the heat to be evenly spread in each of semiconductor wafers 5 (e.g., all of the semiconductor wafers 5 are heated to have the temperature T2). The chamber 30 may be heated to its predetermined temperatures by controlling heat output from the sidewall heaters 81 and 82. The heat output from each of the sidewall heaters 81 and 82 is adjustable independent of the other sidewall heaters. The heat output setting of each sidewall heater may be adjusted either manually by a user or controlled automatically via the control module 90 in conjunction with control signals generated by the temperature sensors disposed in the wafer fabricating system 10 and/or based on the temperature output settings derived from experience and empirical data correlated with the size of wafer being processed. Alternatively or additionally, the pre-stage adjustment process includes adjusting the pressure in the chamber 30 to a processing pressure at which the deposition process is conducted. The vacuum in the chamber 30 may be created by actuating the pump 74.

In some embodiments, a film deposition process is performed in the chamber 30 for forming a film on the semiconductor wafers 5 after operation S102. In some embodiments, as shown in FIG. 3, after the environment in the chamber 30 is tuned to a predetermined condition, for example the temperature are heated to have temperature T2, a film deposition process is started performing. In the present embodiment, the film deposition process is performed by repeating an ALD cycle multiple times so as to form monolayers on the semiconductor wafer 5. In one exemplary embodiment, each ALD cycle includes operations S103-S106, and one or more semiconductor arrangements formed by this methodology are illustrated in FIGS. 4A-4E. By way of example and without limitation, a MIM capacitor is fabricated in the process shown in FIGS. 4A-4E.

Figure 4B:
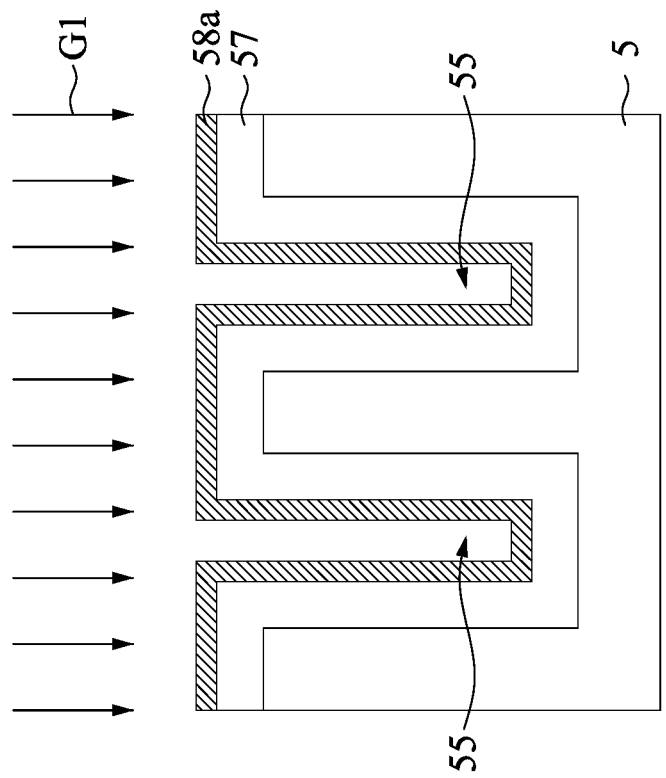
FIG. 4B shows a schematic view of a stage of a method of forming a film on a semiconductor wafer in which a first processing gas is supplied over the semiconductor wafer, in accordance with some embodiments.
Figure 4A:
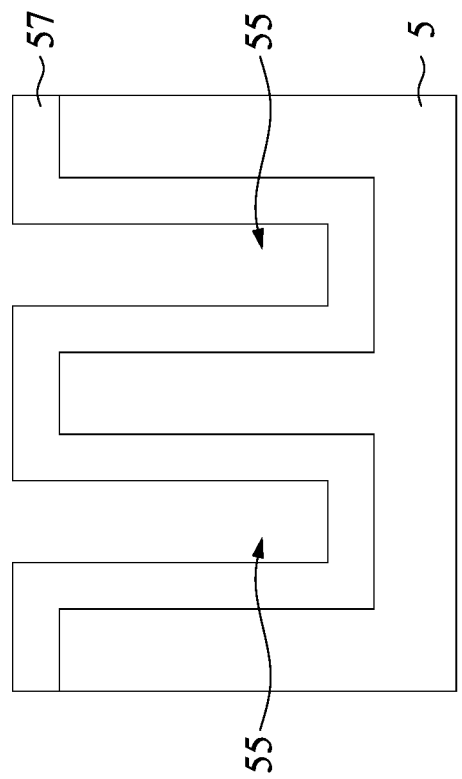
FIG. 4A shows a schematic view of a stage of a method of forming a film on a semiconductor wafer in which trenches are formed on the semiconductor wafer, in accordance with some embodiments.
Figure 4C:
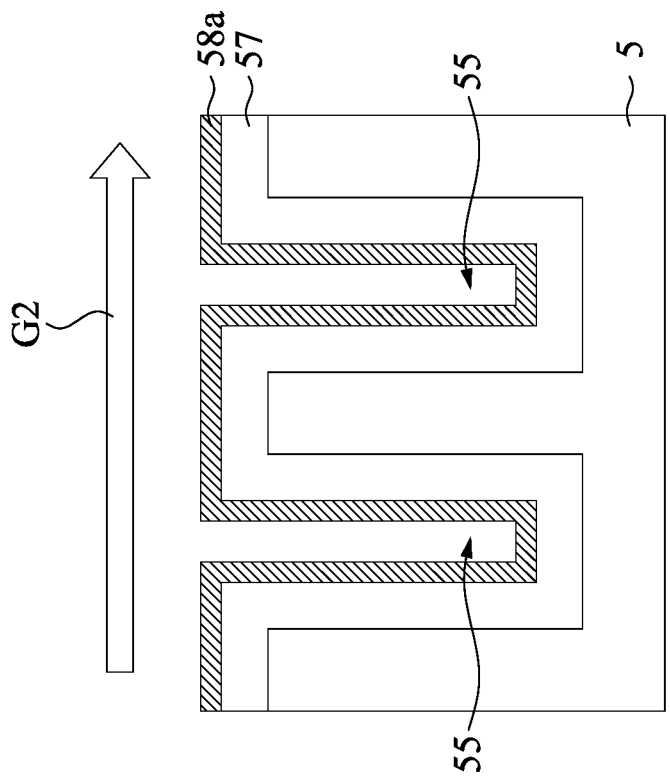
FIG. 4C shows a schematic view of a stage of a method of forming a film on a semiconductor wafer in which a first purging gas is supplied over the semiconductor wafer, in accordance with some embodiments.
Figure 4D:
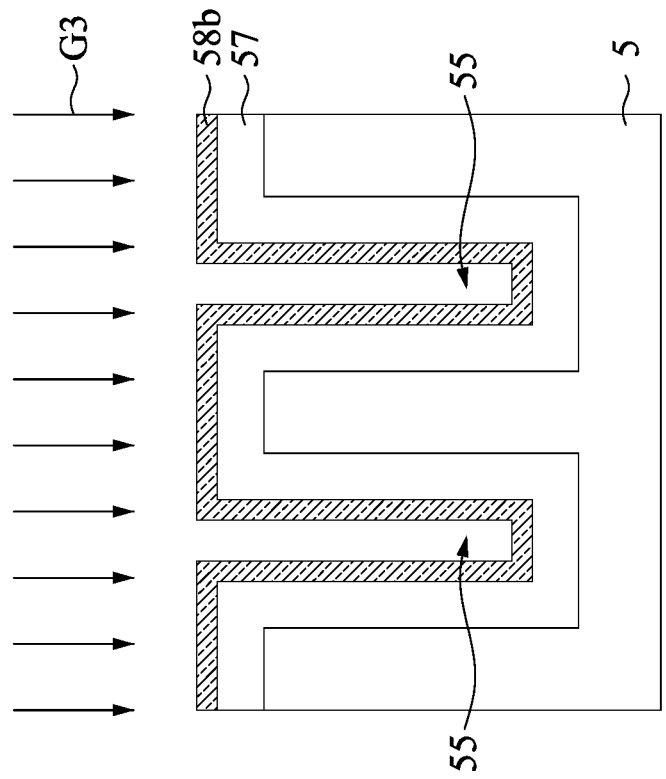
FIG. 4D shows a schematic view of a stage of a method of forming a film on a semiconductor wafer in which a second processing gas is supplied over the semiconductor wafer, in accordance with some embodiments.
Figure 4E:
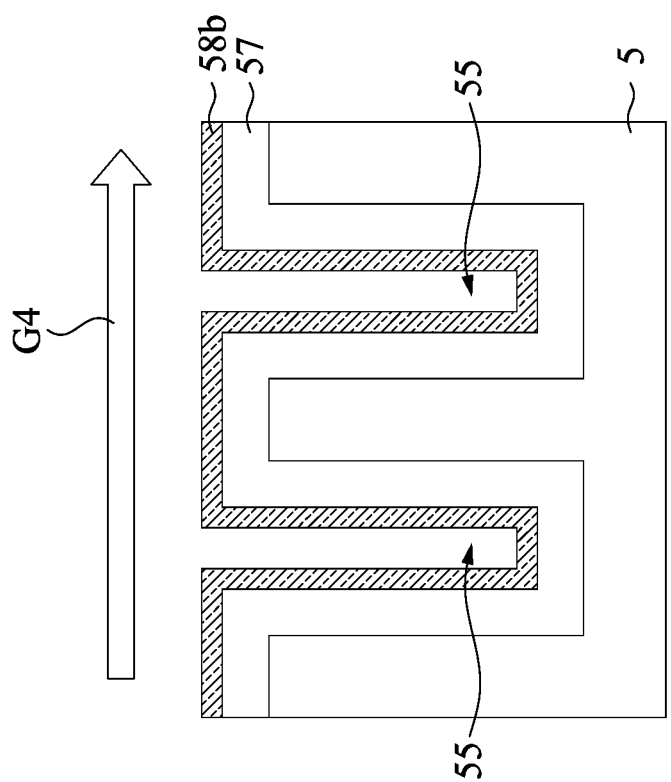
FIG. 4E shows a schematic view of a stage of a method of forming a film on a semiconductor wafer in which a second purging gas is supplied over the semiconductor wafer, in accordance with some embodiments.

In some embodiments, as show in FIG. 4A, before the ALD process is executed, a number of trenches 55 are formed by etching. The etching processes are designed to produce trenches 55 of any suitable height and width on the semiconductor wafer 5. This may be achieved by controlling etching time or by controlling other etching parameter(s). After the trenches 55 are formed, the dielectric layer 57 is deposited on the semiconductor wafer 5 with a conformal profile, covering the trenches 55. The dielectric layer 57 may include a single dielectric material layer or multiple dielectric material layers. Suitable dielectric materials for the dielectric layer 57 include silicon oxides, silicon nitrides, silicon carbides, fluoro-silicate glass (FSG), low-K dielectric materials, other suitable dielectric materials, or a combination thereof. The dielectric layer 57 may be deposited by any suitable technique including thermal growth, CVD, HDP-CVD, PVD, ALD, and/or spin-on techniques. In the illustrated embodiment, an ALD process is used as conformal deposition technique.

In operation S103, a first processing gas G1 is injected into the chamber 30 to form a monolayer on the semiconductor wafer 5. In some embodiments, to create a pulse of the first processing gas G1, the flow controlling member 64a is turned on based on a control signal issued from the control module 90 for a predetermined time duration of about 0.1 to 10 seconds, and then the first processing gas G1 is supplied into the chamber 30 through the gas tube 62a from the gas source 66a. In some embodiments, as shown in FIG. 4B, after the supply of the first processing gas G1, a thin metal containing layer 58a is formed over the dielectric layer 57.

In some embodiments, the first processing gas G1 may be a metal ($M_1$) containing gas with the formula $M_1L_T$ or $M_1E_U$ where L is a halogen (F, Cl, Br, I) and T is an integer greater than 0 or where E is an organic moiety containing carbon (C) and hydrogen (H), or C, H and nitrogen (N), or C, H and oxygen (O) and where U is an integer >0. In some embodiments, the metal $M_1$ is Ta, Ti, or W. A representative source gas for Ta is Ta{N(CH$_3$)$_2$}$_5$ also known as PDMAT and for W is WF$_6$. A Ti source gas is TiCl$_4$ or Ti{OCH(CH$_3$)$_2$}$_4$ may be used if there is a concern about chloride contamination. In some embodiments, the first processing gas G1 is injected into the chamber 30 at a flow rate from about 10 to 1000 standard cubic centimeters per minute (sccm) for a period of from 0.1 to 10 seconds. Optionally, the first processing gas G1 may be injected with an inert carrier gas that is Ar, He, or N$_2$. In the present embodiment, the first processing gas is TiCl$_4$.

In operation S104, a first purging gas G2 is injected into the chamber 30 to purge unreacted first processing gas G1. In some embodiments, to create a pulse of the first purging gas G2, the flow controlling member 64b is turned on based on a control signal issued from the control module 90 for a predetermined time duration of about 0.1 to 10 seconds, and then the first purging gas G2 is supplied into the chamber 30 through the gas tube 62b from the gas source 66b. The first purging gas G2 may include inert gas such as Ar, He, or N$_2$. A monolayer 58a of first processing gas G1 remains on the semiconductor wafer 5.

In operation S105, a second processing gas G3 is injected into the chamber 30 to form a monolayer on the semiconductor wafer 5. In some embodiments, to create a pulse of the second processing gas G3, the flow controlling member 64c is turned on based on a control signal issued from the control module 90 for a predetermined time duration of about 0.1 to 10 seconds, and then the second processing gas G3 is supplied into the chamber 30 through the gas tube 62c from the gas source 66c. In some embodiments, the second processing gas G3 is a nitrogen source gas such as NH$_3$ or N$_2$H$_4$ and is flowed at a rate of between 10 and 1000 sccm for a period of 0.1 to 10 seconds. The nitrogen source gas may or may not form a monolayer on the first processing gas monolayer before reacting to form a monolayer 58b that is a metal nitride (M$_1$N). In the present embodiment, the metal nitride (M$_1$N) is TiN.

In operation S106, a second purging gas G4 is injected into the chamber 30 to purge unreacted second processing gas G3 and byproduct such as HCl. In some embodiments, the second purging gas G4 is supplied from the same source 66b as the first purging gas G2. In such case, to create a pulse of the second purging gas G4, the flow controlling member 64b is turned on based on a control signal issued from the control module 90 for a predetermined time duration of about 0.1 to 10 seconds, and then the second purging gas G4 is supplied into the chamber 30 through the gas tube 62b from the gas source 66b. The second purging gas G4 may include inert gas such as Ar, He, or N$_2$. A monolayer of a metal nitride (M$_1$N) remains on the semiconductor wafer 5.

In some embodiments, during operations S103-S106 mentioned above and the following operations S107-S110, a vacuum is consecutively applied by the pump 74. In such case, the unreacted gaseous material, the purging gas, byproduct gaseous material, and/or particles scrapped from the inner wall of the chamber 30 can be removed from the chamber 30.

In operation S107, an acceptable film thickness is determined. In some embodiments, the film thickness is determined by recording and monitoring the number of monolayers that have been deposited up to that point with an aid of a process control program in the control module 90. Since each monolayer has a known thickness (e.g. 1 Angstrom to 35 Angstroms), a thickness of the film deposited on the semiconductor wafer 5 can be calculated. In cases where the thickness of the film is less than an acceptable film thickness the method continues with repeating operations S103-S107; otherwise, the film deposition process is completed, and the semiconductor wafers 5 are ready to be processed by another process steps, for example, doping.

However, a metal contamination may be condensed on the surfaces of the semiconductor wafers 5 after the film deposition process due to transfer of the residual first processing gas G1 on the surfaces of the semiconductor wafers 5 from a gas phase at the processing temperature (e.g., temperature T2 of FIG. 3) to a solid/liquid phase at room temperature (e.g., temperature T1 of FIG. 3). The metal contamination on the surfaces of the semiconductor wafers 5 may adversely affect the following process steps and leads to a reduction in a production yield. In addition, the metal contaminations may be accumulated on the wafer boat or inner walls of the chamber 30 and contaminate next batch of semiconductor wafers to be processed. To prevent such contamination from occurring, operation S108 is performed to remove residual on the semiconductor wafers 5.

Figure 5:
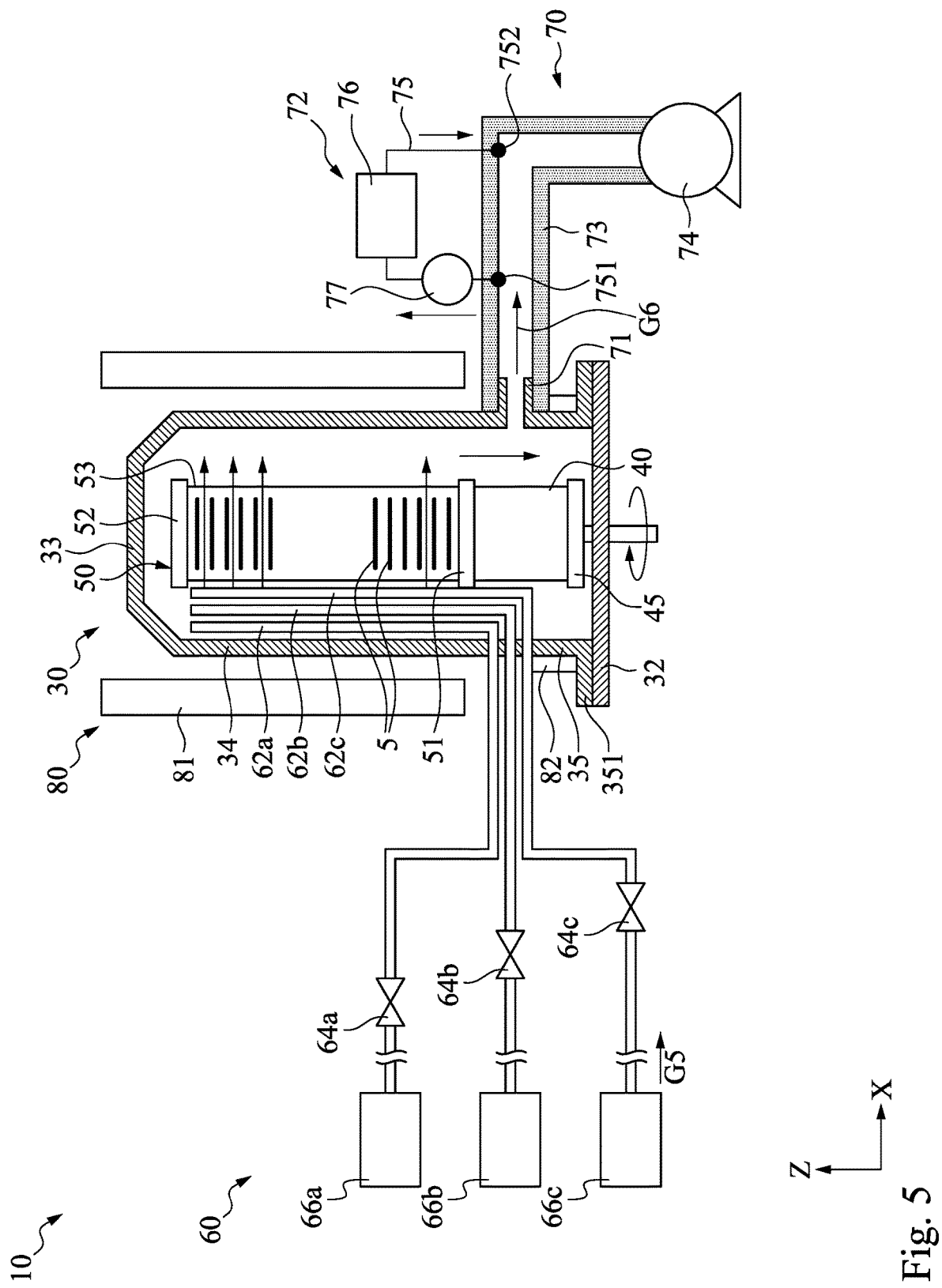
FIG. 5 shows a schematic view of a stage of a method of forming a film on a semiconductor wafer in which an exhaust flow in an exhaust conduit is monitored, in accordance with some embodiments.

In operation S108, a cleaning gas G5 is injected into the chamber 30 to remove residual gaseous material on the semiconductor wafer 5 and/or in the chamber 30. In some embodiments, the cleaning gas G5 is supplied from the same source 66c as the first purging gas G2. In such case, as shown in FIG. 5, to create a flow of the cleaning gas G5, the flow controlling member 64c is turned on based on a control signal issued from the control module 90 for a predetermined time duration P1 (see FIG. 3), and then the cleaning gas G5 is supplied into the chamber 30 through the gas tube 62c from the gas source 66c. An exhaust flow including the cleaning gas G5, residual gaseous material (e.g., the first processing gas G1), byproduct gaseous material (e.g., HCl), and/or particles is then pumped out of the chamber 30 through the exhausting tube 73.

In some embodiments, the predetermined time duration P1 for supplying the cleaning gas G5 is controlled by the control module 90, and the predetermined time duration P1 is determined according to detection signal produced by operation S109. Specifically, in operation S109, residual of the first processing gas G1 in the exhaust flow G6 is detected by the gas sensor 76, and then the gas sensor 76 produces detection signal according to a result of the detection. In the present embodiment, a concentration of the processing gas G1 in the exhaust flow G6 is detected, and the detection signal is produced based on the detected concentration of the processing gas G1. However, it should be appreciated that many variations and modifications can be made to embodiments of the disclosure. The parameter in relation to the exhaust flow G6 may include a composition (i.e., the species) of the exhaust flow G6, a flow rate of the exhaust flow G6, a concentration of the second processing gas, a concentration of the byproduct (e.g., HCl), and a concentration of particles.

In some embodiments, to allow the exhaust flow G6 in the exhaust conduit 73 to flow into the gas line 75, the valve 77 is turned on in the beginning of operation S109. When the valve 77 is turned on, a portion of the exhaust flow G6 flows into the gas line 75 and passes through the gas sensor 76. In some embodiments, the valve 77 is not turned off until the end of operation S109. By controlling the valve 77 turning off during the film deposition process, the deposit of the process gas in the gas detection module 73 can be avoided, and the lifespan of the gas detection module 73 is prolonged.

In some embodiments, the detection signal from the gas sensor 76 is evaluated by the control module 90 in operation S110 to determine the predetermined time duration P1 for operation S108.

In some embodiments, the predetermined time duration P1 in FIG. 3 is determined according to a real-time gas concentration of the processing gas G1, and the detection of residual of first processing gas G1 of operation S109 will not be stopped before the end of operation S108. For example, during operation S108, detection signal, in relation to the concentration of the processing gas G1, is consecutively generated by the gas sensor 76 and compared with a preset threshold value by the control module 90. Once the detection signal lower than the preset threshold value, the control module 90 triggers a control signal to turn off the flow controlling member 64c so that operation S108 is terminated and the method continues to operation S111; otherwise the method S100 repeats operation S108-S110. The operation S109 may be ended at the same time with operation S108 or be ended after the end of operation S108. In some embodiments, the threshold value of gas concentration is, for example, an expected maximum value of gas concentration that can adequately prevent the metal contamination from condensing on the surfaces of the semiconductor wafers 5 after temperature drops. The maximum value can be determined from experience and empirical data correlated with the semiconductor wafers being processed.

In alternation, the predetermined time duration P1 is determined according to a gas concentration of the processing gas G1 collected at an early stage of operation S108, and the detection of residual of first processing gas G1 of operation S109 will be stopped before the end of operation S108. For example, in the beginning of operation S108, detection signal, in relation to the concentration of the processing gas G1, is generated by the gas sensor 76 and calculated by the control module 90 to calculate the predetermined time duration P1. Once the calculation of the predetermined time duration P1 is finished, operation S109 is terminated, and operation S108 continues for the calculated predetermined time duration P1.

In some embodiments, the predetermined time duration P1 is determined according to experience and empirical data correlated with the pattern density of the semiconductor wafers 5 being processed. For example, the predetermined time duration P1 for semiconductor wafers 5 with higher pattern density is longer than that for semiconductor wafers 5 with lower pattern density. A lookup table of the predetermined time duration P1 in relation to the pattern density of the semiconductor wafers 5 may be stored in the memory 92. The processor 91 matches the pattern density of the semiconductor wafers 5 and the predetermined time duration P1 and transmits control signals to the flow controlling member 64c according to the matching results.

In cases where the predetermined time duration P1 is directly determined according to experience and empirical data, operation S109 and operation S110 can be omitted, and the semiconductor wafers 5 processed by the chamber 30 will be inspected to check if there is any contamination caused by the metal condensation. In condition that contaminations are found on the semiconductor wafers 5 which means the data in the lookup table is offset from a real process condition, a modification to the lookup table will be conducted. For example, an occurring of contamination on the semiconductor wafers 5 may indicate insufficient time for supplying the cleaning gas G5, and thus the lookup table will be modified to prolong the predetermined time duration P1. Therefore, next batch of semiconductor wafers 5 can be processed by utilizing the modified lookup table, the reliability of the process is therefore improved. Alternatively, operation S109 is performed no matter how the predetermined time duration P1 is determined, and the lookup table may be modified based on the detection signal produced in operation S109 as well as the inspection results of the semiconductor wafers 5.

In some embodiments, the flow rate of the cleaning gas G5 is adjusted according to the evaluation of the parameter in relation to the first processing gas G1 in operation S109. For example, when the concentration of the first processing gas G1 or a by-product gaseous material is over a threshold value, the control module 90 may issue a control signal to the flow controlling member 64c to increase a flow rate of cleaning gas G5 rather than increase the time duration for supplying the cleaning gas. Since the cleaning gas G5 is supplied into the chamber 30 by a greater flow rate, the residual first processing gas G1 in the chamber 30 may be quickly consumed or purged.

After the completion of operation S108, the method S100 continues with operation S111, in which a post-stage adjustment is performed to return the pressure in the chamber 30 from a vacuum to an ambient pressure by supplying purging gas such as the first purging gas G2 into the chamber 30. In some embodiments, as shown in FIG. 3, during the operation S111, the temperature of the chamber 30 slightly decreases from high temperature T2 to a lower temperate T3 due to injection of a large volume of the purging gas G2 into the chamber 30. In some embodiments, before the beginning of the operation S111, operation S109 and operation S110 are finished, the exhaust flow G6 in the exhaust conduit 73 is not detected.

In some embodiments, the predetermined time duration P1 for operation S108 may be less than the time duration for supplying the purging gas in operation S111. However, it should be appreciated that many variations and modifications can be made to embodiments of the disclosure. The predetermined time duration P1 may be equal to or longer than the time duration for supplying the second purging gas.

Figure 6:
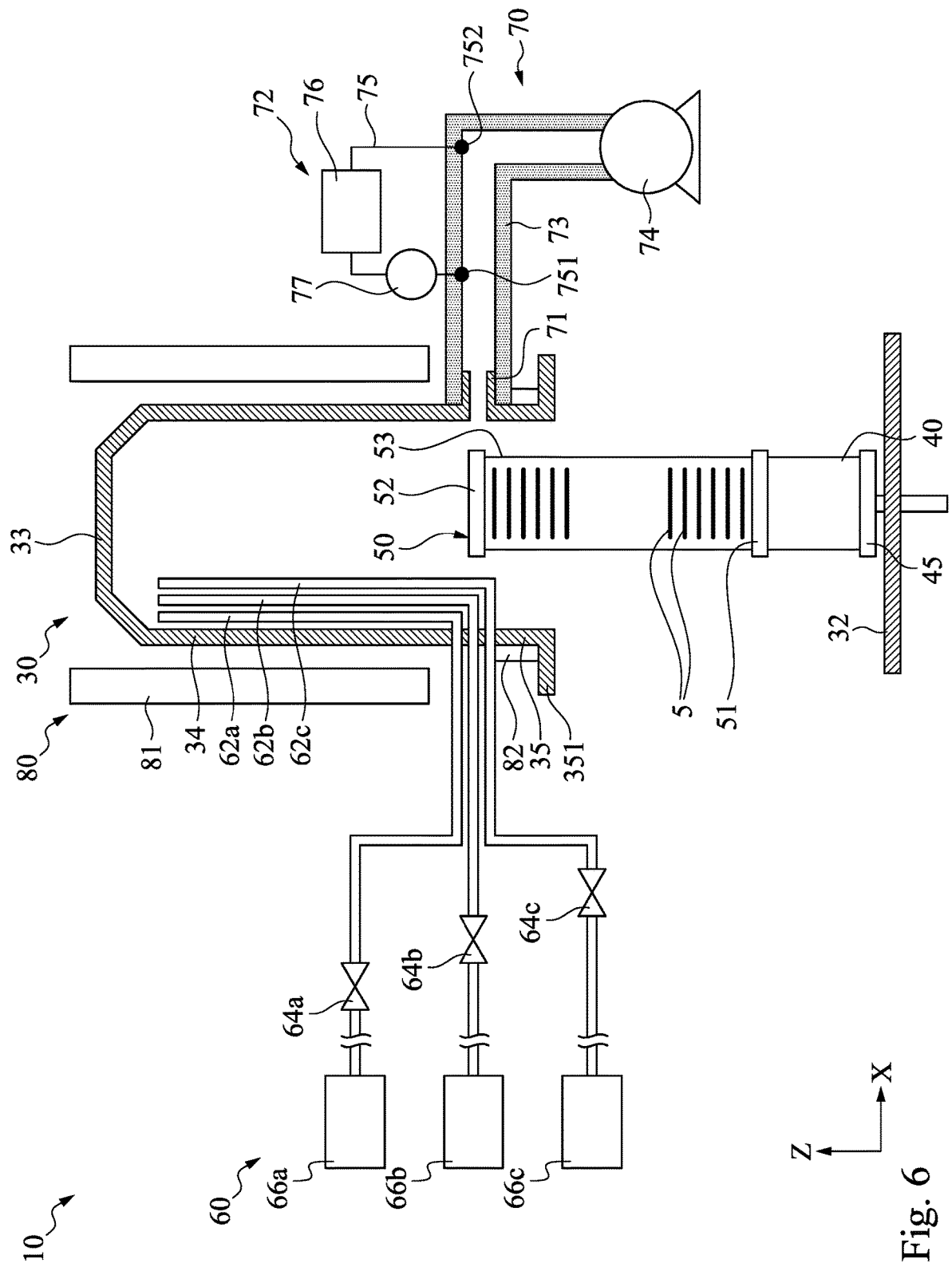
FIG. 6 shows a schematic view of a stage of a method of forming a film on a semiconductor wafer in which a boat loading multiple semiconductor wafers are lowered down from a furnace, in accordance with some embodiments.

The method S100 continues with operation S112, in which the semiconductor wafers 5 are unloaded. In some embodiments, as shown in FIG. 6, to unload the semiconductor wafers 5 from the wafer boat 50, the sealing lid 32 is separated from the tube 31 and the insulation cap 40 and the wafer boat 50 are moved outside the cavity defined by the tube 31. The semiconductor wafers 5 may be removed from the wafer boat 50 by a robot arm (not shown in figures) with a blade.

Figure 7:
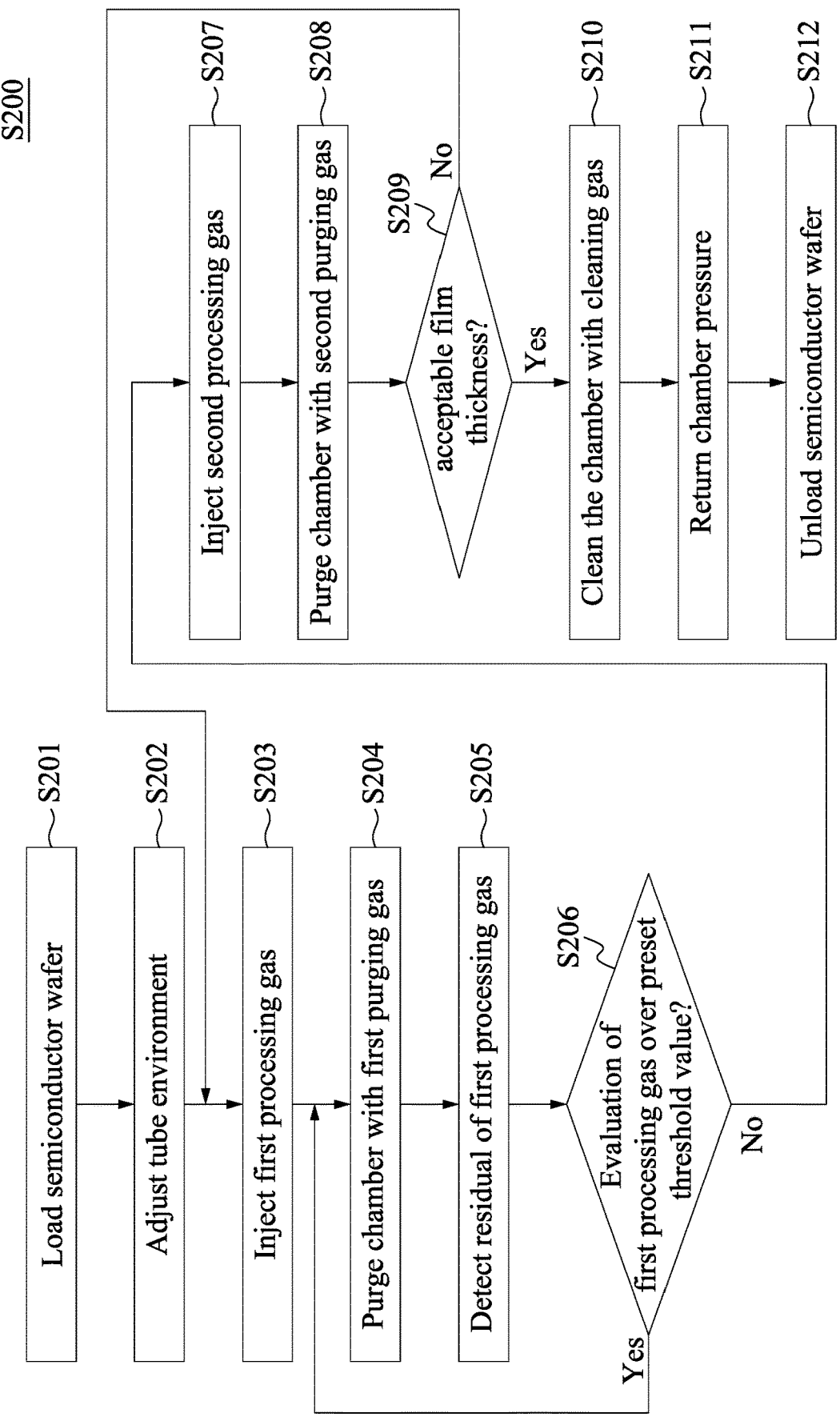
FIG. 7 shows a flow chart illustrating a method for processing semiconductor wafers in a wafer fabricating system, in accordance with some embodiments.
Figure 8:
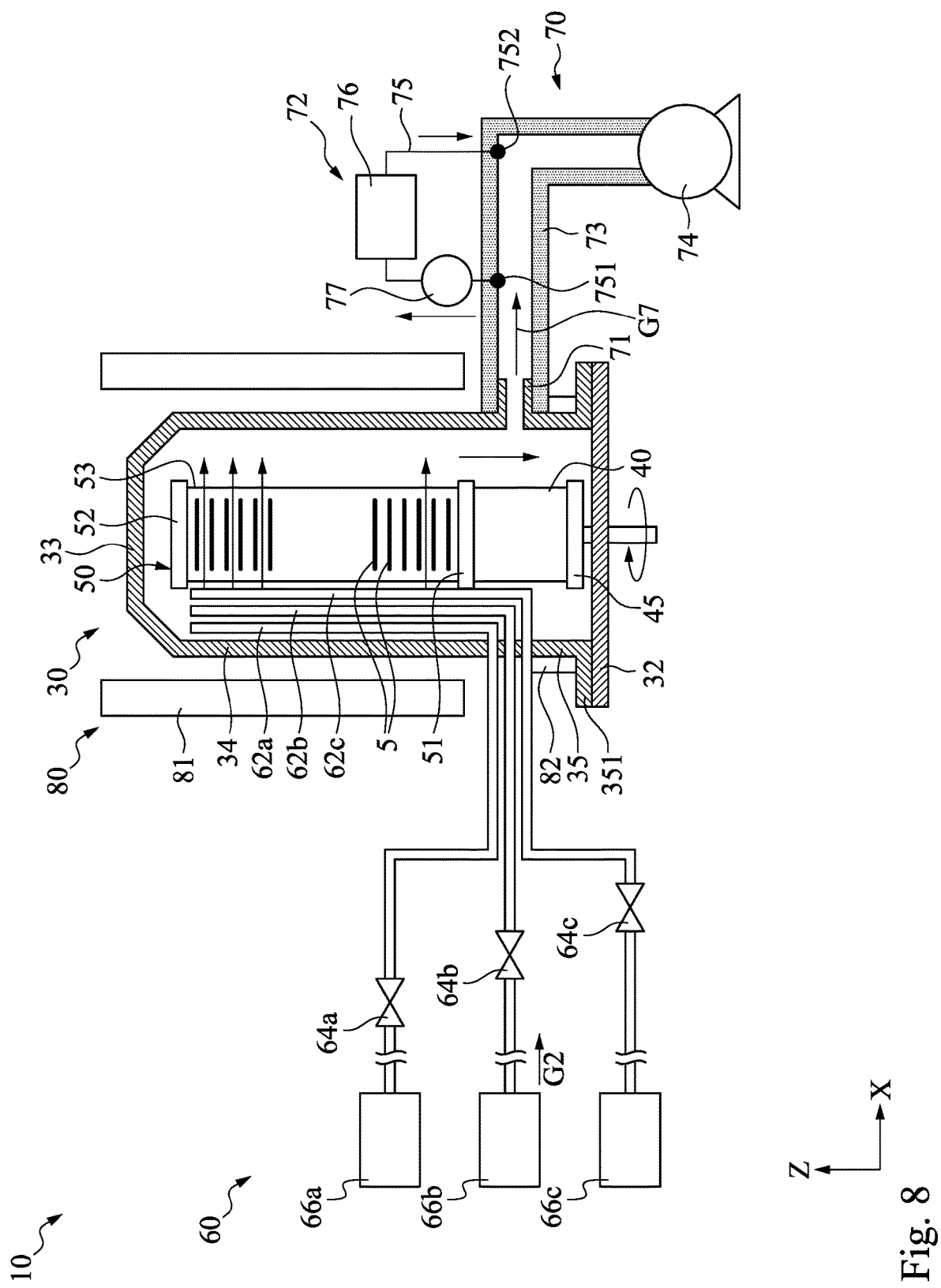
FIG. 8 shows a schematic view of a stage of a method of forming a film on a semiconductor wafer in which an exhaust flow in an exhaust conduit is monitored, in accordance with some embodiments.
Figure 9:
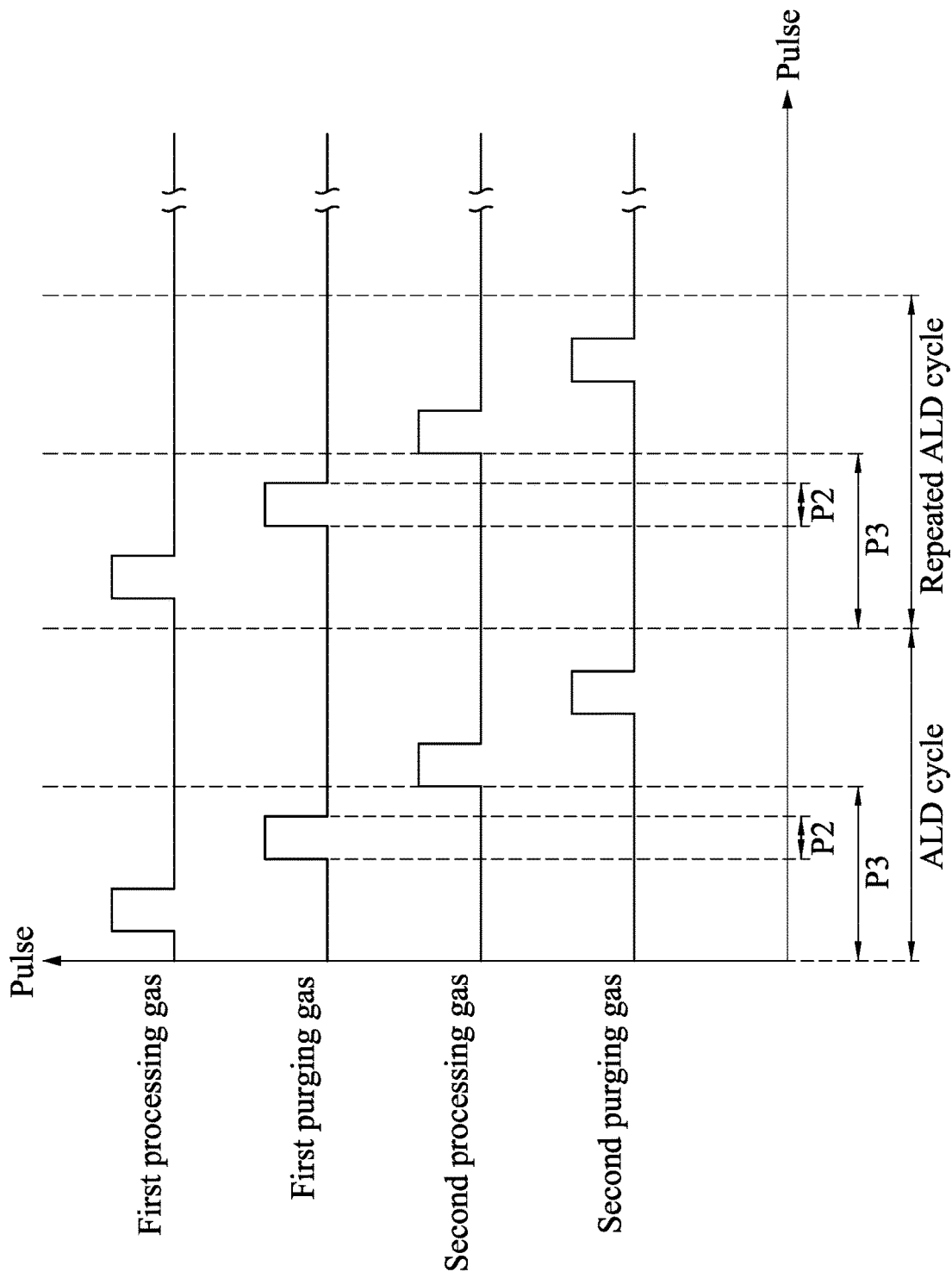
FIG. 9 shows a schematic of a cycling process illustrating a method of forming a film on a semiconductor wafer, in accordance with some embodiments.

FIG. 7 is a flow chart illustrating a method S200 for processing semiconductor wafers 5 in the wafer fabricating system 10, in accordance with some embodiments. FIG. 8 shows a schematic view of a stage of a method of forming a film on a semiconductor wafer, in accordance with some embodiments. FIG. 9 shows a schematic of a cycling process illustrating a method of forming a film on a semiconductor wafer, in accordance with some embodiments. For illustration, the flow chart will be described along with the drawings shown in FIGS. 1, 8 and 9. Additional operations can be provided before, during, and after the method S200, and some of the operations described can be replaced or eliminated for other embodiments of the method.

In some embodiments, the method S200 includes operations S201-S212. Operations S201-S204 are substantially the same operations S101-S104 in the above-mentioned method S100, operations S207-S209 are substantially the same operation S105-S107, operations S210, S211 and S212 are substantially the same operation S108, S111 and S112, and thus are not repeated for the sake of brevity.

In some embodiments, during the film deposition process (i.e., operations S203-S209) of method S200, as shown in FIG. 8, an exhaust flow G7 is created by pumping out gaseous material, for example, including the first and the second processing gases and the first and the second purging gases, out of the chamber 30 through the exhausting tube 73.

In some embodiments, uniformity of monolayer in each ALD cycle occurs because the second processing gas G3 reacts with residual first processing gas G1 floating in the chamber 30 rather than the monolayer on the semiconductor wafers 5. This uniformity of monolayer may adversely affect the following process steps and leads to a reduction in a production yield. To prevent such uniformity from occurring, operations S205 and operation S206 are performed to determine a predetermined time duration for supplying the first purging gas G2.

In operation S205, residual of the first processing gas G1 in the exhaust flow G7 is detected by the gas sensor 76, and then the gas sensor 76 produces detection signal according to a result of the detection. In the present embodiment, a concentration of the processing gas G1 in the exhaust flow G7 is detected, and the detection signal is produced based on the detected concentration of the processing gas G1. However, it should be appreciated that many variations and modifications can be made to embodiments of the disclosure. The parameter in relation to the exhaust flow G7 may include a composition (i.e., the species) of the exhaust flow G7, a flow rate of the exhaust flow G7, and a concentration of particles.

In some embodiments, to allow the exhaust flow G7 in the exhaust conduit 73 to flow into the gas line 75, the valve 77 is controlled by the control module 90 to turn on. When the valve 77 is turned on, a portion of the exhaust flow G7 flows into the gas line 75 and passes through the gas sensor 76. By controlling the valve 77 turning off during the supply of the second processing gas G2 (i.e., operation S207), the deposit of the process gas in the gas detection module 73 can be avoided, and the lifespan of the gas detection module 73 is prolonged. In some embodiments, the valve 77 is turned on for a time duration P3 in each ALD cycle. In some embodiments, as shown in FIG. 9, the time duration P3 may last out from the beginning of the ALD cycle to a moment when the second processing gas is supplied. Alternatively, the time duration P3 may last out from the beginning of the ALD cycle to a moment when the supply of the first purging gas G2 is finished.

In some embodiments, the detection signal from the gas sensor 76 is evaluated by the control module 90 in operation S206 to determine a predetermined time duration P2 for operation S204.

In some embodiments, the predetermined time duration P2 is determined according to a real-time gas concentration of the processing gas G1, and the detection of residual of first processing gas G1 of operation S205 will not be stopped before the end of operation S204. For example, during operation S204, detection signal, in relation to the concentration of the processing gas G1, is consecutively generated by the gas sensor 76 and compared with a preset threshold value by the control module 90. Once the detection signal lower than the preset threshold value, the control module 90 triggers a control signal to turn off the flow controlling member 64b so that operation S204 is terminated and the method continues to operation S207. The operation S205 may be ended at the same time with operation S204 or be ended after the end of operation S204. In some embodiments, the threshold value of gas concentration is, for example, an expected maximum value of gas concentration that can adequately prevent the uniformity of monolayer formed on the surfaces of the semiconductor wafers 5. The maximum value can be determined from experience and empirical data correlated with the semiconductor wafers being processed.

In alternation, the predetermined time duration P2 is determined according to a gas concentration of the processing gas G1 collected at an early stage of operation S204, and the detection of residual of first processing gas G1 of operation S205 will be stopped before the end of operation S204. For example, in the beginning of operation S204, detection signal, in relation to the concentration of the processing gas G1, is generated by the gas sensor 76 and calculated by the control module 90 to calculate the predetermined time duration P2. Once the calculation of the predetermined time duration P2 is finished, operation S205 is terminated, and operation S204 continues for the calculated predetermined time duration P2.

In some embodiments, the predetermined time duration P2 is determined according to experience and empirical data correlated with the pattern density of the semiconductor wafers 5 being processed. For example, the predetermined time duration P2 for semiconductor wafers 5 with higher pattern density is longer than that for semiconductor wafers 5 with lower pattern density. A lookup table of the predetermined time duration P2 in relation to the pattern density of the semiconductor wafers 5 may be stored in the memory 92. The processor 91 matches the pattern density of the semiconductor wafers 5 and the predetermined time duration P2 and transmits control signals to the flow controlling member 64b according to the matching results.

In cases where the predetermined time duration P2 is directly determined according to experience and empirical data, operation S205 and operation S206 can be omitted, and the semiconductor wafers 5 processed by the chamber 30 will be inspected to check if the uniformity or film thickness is acceptable. In condition that uniformity or film thickness is outside a process window which means the data in the lookup table is offset from a real process condition, a modification to the lookup table will be conducted. For example, an occurring of film thickness less than a desired value may indicate insufficient time for supplying the first purging gas G2, and thus the lookup table will be modified to prolong the predetermined time duration P2. Therefore, next batch of semiconductor wafers 5 can be processed by utilizing the modified lookup table, the reliability of the process is therefore improved. Alternatively, operation S205 is performed no matter how the predetermined time duration P2 is determined, and the lookup table may be modified based on the detection signal produced in operation S205 as well as the inspection results of the semiconductor wafers 5.

In some embodiments, the flow rate of the first purging gas G2 is adjusted according to the evaluation of the parameter in relation to the first processing gas G1 in operation S206. For example, when the concentration of the first processing gas G1 is over a threshold value, the control module 90 may issue a control signal to the flow controlling member 64b to increase a flow rate of the first purging gas G2 rather than increase the time duration for supplying the first purging gas G2. Since the first purging gas G2 is supplied into the chamber 30 by a higher flow rate, the residual first processing gas G1 in the chamber 30 may be quickly consumed or purged.

After the completion of operation S204, the method S200 continues with operations S207-S212. In some embodiments, the time duration of supplying the cleaning gas in operation S210 can be determined by executing operations S109 and operation S110. As a result, the film uniformity and production yield can be significantly improved.

However, the wafer fabricating system 10 is not limited to perform ALD process and may be used wherever a processing gas is supplied to a chamber and passes through a surface of the wafer 5. For example, the wafer fabricating system 10 may be a system for performing a normal CVD process, an etching or an annealing process in semiconductor fabrication. In the case where the method applied to etching process, a parameter in relation to t etching gas after tool dry clean process can be monitored.

This disclosure may also be incorporated into other processing steps in semiconductor fabrication. For example, the real time monitoring gaseous material in exhaust conduit may be performed in an etching process. In such case, a parameter in relation to the etching gas after tool dry clean process can be monitored, to determine whether a residual gas for cleaning the chamber is purged and will not contaminate next wafer to be processed by the chamber.

Embodiments of a wafer fabricating system having a gas sensor installed at an exhaust conduit to do real-time monitor on concentration of residual gas or by-product produced during the processing. The installation of the gas sensor provides real time information about residual gas or by-product. As a result, the processing parameter can be properly controlled. In addition, specs for different products or processes regarding their pattern density or film scheme can be fine-tuned according to the detect results, and thus the production yield of semiconductor wafer is improved.

In accordance with some embodiments, a method for processing semiconductor wafer is provided. The method includes loading a semiconductor wafer into a chamber. The method also includes creating an exhaust flow from the chamber. The method further includes depositing a film on the semiconductor wafer by supplying a processing gas into the chamber. In addition, the method includes detecting, with a use of a gas sensor, a concentration of the processing gas in the exhaust flow and generating a detection signal according to a result of the detection. The method further includes supplying a cleaning gas into the processing chamber for a time period after the film is formed on the semiconductor wafer. The time period is determined based on the detection signal.

In accordance with some embodiments, a method for processing semiconductor wafer is provided. The method includes loading a semiconductor wafer into a chamber. The method also includes creating an exhaust flow from the chamber. The method further includes depositing a film on the semiconductor wafer by alternately supplying a first processing gas and a second processing gas into the chamber multiple times. In addition, the method includes detecting, with a use of a gas sensor, a concentration of the first processing gas in the exhaust flow and generating a detection signal according to a result of the detection. The method further includes supplying a first purging gas into the processing chamber for a time period between the supply of the first processing gas and the supply of the second processing gas. The time period is determined based on the detection signal.

In accordance with some embodiments, a wafer fabricating system for processing semiconductor wafer is provided. The system includes a chamber and a wafer boat. The boat is positioned in the chamber configured to support at least one semiconductor wafer. The wafer fabricating system also includes gas supplying module in gaseous communication with the chamber and configured to supply a processing gas into the chamber. The wafer fabricating system further includes an exhaust conduit, a pump and a gas sensor. The exhaust conduit is connected to the chamber. The pump is connected to the exhaust conduit and configured to create an exhaust flow from the chamber. The gas sensor is connected to the exhaust conduit and configured to produce a detection signal based on a parameter in relation to the processing gas. In addition, the wafer fabricating system includes a control module. The control module is electrically connected to the gas sensor and the gas supplying module and configured to control a time duration for supplying a cleaning gas supplied from the gas supplying module into the chamber after the supply of the processing gas based on the detection signal.

In some embodiments, a method for processing semiconductor wafer is provided. The method includes introducing a first processing gas of an atomic layer deposition (ALD) process on the semiconductor substrate in a chamber; introducing a second processing gas of the ALD process on the semiconductor substrate in the chamber; creating an exhaust flow from the chamber; monitoring a concentration of the first processing gas of the ALD process in the exhaust flow; in response to the monitored concentration of the first processing gas of the ALD process in the exhaust flow, introducing a cleaning gas into the chamber. In some embodiments, the method further includes determining a flow rate of the cleaning gas based on the concentration of the first processing gas. In some embodiments, the method further includes determining a time duration of introducing the cleaning gas based on a pattern density of a wafer in the chamber. In some embodiments, the method further includes after introducing the first processing gas and prior to introducing the second processing gas, supplying a purging gas into the chamber. In some embodiments, the monitoring the concentration of the first processing gas is performed during supplying the purging gas into the chamber. In some embodiments, introducing the first and second processing gases are performed prior to introducing the cleaning gas into the chamber. In some embodiments, introducing the first processing gas is performed prior to introducing the cleaning gas into the chamber and introducing the second processing gas is performed after introducing the cleaning gas into the chamber. In some embodiments, the first processing gas comprises metal chloride. In some embodiments, the second processing gas comprises ammonia or hydrazine.

In some embodiments, a method for processing semiconductor wafer is provided. The method includes creating an exhaust flow from a chamber having the semiconductor substrate therein; introducing a first processing gas of an atomic layer deposition (ALD) process on the semiconductor substrate in the chamber; supplying a first purging gas into the chamber; monitoring a concentration of the first processing gas of the ALD process in the exhaust flow; determining whether supplying a second purging gas into the chamber based on the monitored concentration of the first processing gas of the ALD process in the exhaust flow; in response to the determining that the monitored concentration is not acceptable, supplying the second purging gas into the chamber; introducing a second processing gas of the ALD process on the semiconductor substrate in the chamber. In some embodiments, the method further includes after introducing the second processing gas, supplying a third purging gas into the chamber. In some embodiments, the method further includes after introducing the second processing gas, determining whether a thickness of a film formed on the semiconductor substrate is acceptable. In some embodiments, the method further includes in response to determining that the thickness of the film formed on the semiconductor substrate is not acceptable, introducing a third processing gas of the ALD process on the semiconductor substrate in the chamber. In some embodiments, the third processing gas is the same as the first processing gas. In some embodiments, the method further includes in response to determining that the thickness of the film formed on the semiconductor substrate is acceptable, introducing a cleaning gas into the chamber.

In some embodiments, a method for processing semiconductor wafer is provided. The method includes depositing a film on the semiconductor substrate in a chamber by repeating an atomic layer deposition (ALD) cycle multiple times, the ALD cycle comprising introducing a metal chloride gas into the chamber; creating an exhaust flow from the chamber; monitoring a concentration of the metal chloride gas in the exhaust flow; introducing a cleaning gas into the chamber, wherein a flow rate of the cleaning gas is based on the monitored concentration of the metal chloride gas in the exhaust flow. In some embodiments, the metal chloride is titanium tetrachloride. In some embodiments, the ALD cycle further comprises introducing a nitrogen-based gas into the chamber. In some embodiments, the method further includes determining a time duration of introducing the cleaning gas based on the monitored concentration of the metal chloride gas in the exhaust flow. In some embodiments, the method further includes before introducing the cleaning gas into the chamber, determining whether a thickness of the film formed on semiconductor substrate is acceptable.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a semiconductor substrate, comprising:
   introducing a first processing gas of an atomic layer deposition (ALD) process on the semiconductor substrate in a chamber;
   introducing a second processing gas of the ALD process on the semiconductor substrate in the chamber;
   creating a first exhaust flow from the chamber;
   monitoring a concentration of the first processing gas of the ALD process in the first exhaust flow; and
   in response to the monitored concentration of the first processing gas of the ALD process in the first exhaust flow, introducing a first cleaning gas into the chamber when the semiconductor substrate is in the chamber.

2. The method of claim 1, further comprising:
   determining a flow rate of the first cleaning gas based on the monitored concentration of the first processing gas.

3. The method of claim 1, further comprising:
   determining a time duration of introducing the first cleaning gas based on a pattern density of a wafer in the chamber.

4. The method of claim 1, further comprising:
   after introducing the first processing gas and prior to introducing the second processing gas, supplying a purging gas into the chamber.

5. The method of claim 1, wherein introducing the first and second processing gases are performed prior to introducing the first cleaning gas into the chamber.

6. The method of claim 1, wherein the first processing gas comprises metal chloride.

7. The method of claim 1, wherein the second processing gas comprises ammonia or hydrazine.

8. The method of claim 1, further comprising:
   after introducing the first cleaning gas into the chamber, determining whether the concentration of the first processing gas in a second exhaust flow of the chamber is acceptable; and
   introducing a second cleaning gas into the chamber when the determination determines that the concentration of the first processing gas in the second exhaust flow is not acceptable.

9. A method for processing a semiconductor substrate, comprising:
   depositing a film on the semiconductor substrate in a chamber by repeating an atomic layer deposition (ALD) cycle multiple times, the ALD cycle comprising introducing a metal chloride gas into the chamber;
   introducing a first cleaning gas into the chamber, wherein the first cleaning gas has a first flow rate;
   creating an exhaust flow from the chamber;
   monitoring a concentration of the metal chloride gas in the exhaust flow; and
   introducing a second cleaning gas into the chamber, wherein the second cleaning gas has a second flow rate, the second flow rate is based on the monitored concentration of the metal chloride gas in the exhaust flow, and the second flow rate of the second cleaning gas is greater than the first flow rate of the first cleaning gas.

10. The method of claim 9, wherein the metal chloride gas is titanium tetrachloride gas.

11. The method of claim 9, wherein the ALD cycle further comprises introducing a nitrogen-based gas into the chamber.

12. The method of claim 9, further comprising:
    determining a time duration of introducing the second cleaning gas based on the monitored concentration of the metal chloride gas in the exhaust flow.

13. The method of claim 9, further comprising:
    before introducing the second cleaning gas into the chamber, determining whether a thickness of the film formed on the semiconductor substrate is acceptable.

14. The method of claim 9, wherein the introducing the first and second cleaning gases into the chamber are performed when the semiconductor substrate is in the chamber.

15. A method for processing a semiconductor substrate, comprising:
    introducing a metal chloride gas of an atomic layer deposition (ALD) process on the semiconductor substrate in a chamber;
    supplying a first purging gas into the chamber;
    after supplying the first purging gas, determining whether a concentration of the metal chloride gas in a first exhaust flow of the chamber is within a predetermined range;
    supplying a second purging gas into the chamber when the determination determines that the concentration of the metal chloride gas in the first exhaust flow is not within the predetermined range;
    introducing a processing gas of the ALD process on the semiconductor substrate in the chamber, the processing gas comprising ammonia or hydrazine;
    creating an exhaust flow from the chamber;
    monitoring the concentration of the metal chloride gas of the ALD process in the exhaust flow;
    introducing a cleaning gas into the chamber; and determining a time duration of introducing the cleaning gas based on the monitored concentration of the metal chloride gas in the exhaust flow.

16. The method of claim 15, wherein the metal chloride gas is titanium tetrachloride gas.

17. The method of claim 15, wherein introducing the metal chloride gas and the processing gas are performed prior to introducing the cleaning gas into the chamber.

18. The method of claim 15, further comprising:
after introducing the cleaning gas into the chamber, determining whether a thickness of a film formed on the semiconductor substrate is acceptable.

19. The method of claim 15, further comprising:
determining a flow rate of the cleaning gas based on the monitored concentration of the metal chloride gas in the exhaust flow.

20. The method of claim 15, further comprising:
after supplying the second purging gas, determining whether the concentration of the metal chloride gas in a second exhaust flow of the chamber is within the predetermined range; and
supplying a third purging gas into the chamber when the determination determines that the concentration of the metal chloride gas in the second exhaust flow is not within the predetermined range.

* * * * *